United States Patent [19]

Matsushita et al.

[11] Patent Number: 4,651,192

[45] Date of Patent: * Mar. 17, 1987

[54] CERAMIC PACKAGED SEMICONDUCTOR DEVICE

[75] Inventors: Yasuo Matsushita; Kousuke Nakamura; Mitsuru Ura, all of Hitachi; Fumiyuki Kobayashi, Sagamihara, all of Japan

[73] Assignee: Hitachi, Ltd., Tokyo, Japan

[*] Notice: The portion of the term of this patent subsequent to May 14, 2002 has been disclaimed.

[21] Appl. No.: 751,587

[22] Filed: Jul. 3, 1985

Related U.S. Application Data

[63] Continuation of Ser. No. 446,203, Dec. 2, 1982.

[30] Foreign Application Priority Data

Dec. 4, 1981 [JP] Japan ................................ 56-195986

[51] Int. Cl.⁴ ..................... H01L 23/36; H01L 23/14; H01L 23/02
[52] U.S. Cl. ........................................ 357/74; 357/81; 357/67; 357/80
[58] Field of Search ...................... 357/81, 67, 74, 80, 357/73

[56] References Cited

U.S. PATENT DOCUMENTS

| | | | |
|---|---|---|---|
| 4,142,203 | 2/1979 | Dietz | 357/73 |
| 4,172,109 | 10/1979 | Smoak | 264/65 |
| 4,352,120 | 9/1982 | Kurihara et al. | 357/81 |
| 4,370,421 | 1/1983 | Matsushita et al. | 357/67 |
| 4,517,584 | 5/1985 | Matsushita et al. | 357/67 |

FOREIGN PATENT DOCUMENTS 0028802 5/1981 European Pat. Off. .

Primary Examiner—Andrew J. James
Assistant Examiner—S. V. Clark
Attorney, Agent, or Firm—Antonelli, Terry & Wands

[57] ABSTRACT

A semiconductor device with a semiconductor element encased in a hollow ceramic package. The portion of the package at which the semiconductor element is disposed is formed from SiC admixed with Be or a compound of Be.

6 Claims, 10 Drawing Figures

CERAMIC PACKAGED SEMICONDUCTOR DEVICE

This is a continuation of application Ser. No. 446,203, filed Dec. 2, 1982.

BACKGROUND OF THE INVENTION

The present invention relates to a ceramic packaged semiconductor device with a semiconductor element contained in a hollow package of ceramics.

Semiconductor devices with a semiconductor element such as IC, LSI, etc. contained in a package of ceramics having an inside space and with lead conductors introduced into the package, the semiconductor element and lead conductors being connected with one another by bonding wires in the inside space of the package, are widely used. Similarly, resin-sealed semiconductor devices are also commonly used. A significant problem with such package type semiconductor devices, however, is poor heat dissipation due to the use of the package. Obviously, the poor heat dissipation is a great obstacle to an attempt to make a semiconductor device with a larger capacity, a higher integration density and a smaller size. Thus, a material with a lower heat resistance is required for an insulating substrate for providing a semiconductor element in a ceramics package. Besides, a material for the insulating substrate must satisfy (1) a higher electical insulation, (2) a substantially equal coefficient of thermal expansion to that of silicon, and (3) a higher mechanical strength. Sintered alumina is now used as an insulating substrate which can meet these requirements to some extent. From the standpoint of the thermal resistance, however sintered alumina having a low thermal conductivity, such as 0.05 cal/-sec.cm.°C., is not regarded as a preferable material for the insulating substrate for the semiconductor device, when an attempt to make the integration density higher and the capacity larger is taken into account.

As an approach for improving the heat dissipation characteristic of the ceramic packaged semiconductor device, such a structure as shown in FIG. 1 is proposed, in which a semiconductor element 31 is mounted on the top of a stud 32 of copper which extends through an insulating substrate 301 to the exterior of a ceramic package denoted by numeral 30. In this figure, reference numeral 33 denotes a supporting plate of molybdenum interposed between the semiconductor element 31 and the copper stud 32 to serve for mitigating thermal stress which is possibly produced due to a difference in the coefficient of thermal expansion between the semiconductor element 31 and the stud 32. Reference numeral 34 denotes lead conductors secured to the insulation substrate 301. Numeral 35 denotes bonding wires for connecting, respectively, the inner ends of the lead conductors 34 to the semiconductor element within the cavity of the package 30. Numeral 302 denotes a cap member bonded to the insulating substrate 301 in a hermetical manner and constituting a part of the package 30. Finally, reference numeral 36 denotes a cooling fin mounted on and around the copper stud 32. With this structure, all the heat conducting paths extending from the semiconductor element 31 to the cooling fin 36 are provided by metals having a high thermal conductivity, whereby a semiconductor device having an improved heat dissipation characteristic due to the reduced overall thermal resistance can be obtained. However, the semiconductor device shown in FIG. 1 suffers disadvantages in that an increased number of manufacturing steps are required because of a complicated structure requiring an increased number of components, the weight of the semiconductor device is increased due to the use of heavy components such as those of molybdenum and others, and a troublesome procedure is required for mounting a printed circuit or the like onto the device.

SUMMARY OF THE INVENTION

It is an object of the present invention to provide an improved ceramic-packaged semiconductor device free from the drawbacks of the prior art device described above, in which heat dissipation characteristics are highly improved.

In view of the above object, it is proposed according to an aspect of the present invention that an insulating substrate for mounting thereon a semiconductor element to be hermetically housed within a ceramic package be made from non-oxide ceramic which contains a non-oxide material as a main component and exhibits a coefficient of thermal expansion approximating that of silicon and a thermal conductivity of not smaller than 0.2 cal/sec.cm. °C. at room temperature. With the term "non-oxide ceramics as the main component", it is intended to mean SiC admixed with a small amount of Be or a compound thereof, $Si_3N_4$ admixed with a small amount of Be or a compound thereof, or AlN admixed with a small amount of Be or a compound thereof. The term "coefficient of thermal expansion approximating that of silicon" is to mean a coefficient of thermal expansion of the insulating substrate being approximate to that of silicon semiconductor element to such a degree that when a silicon semiconductor element is bonded to the insulating substrate through an interposed bonding layer, neither destruction nor peeling occurs under a thermal stress due to a difference in the coefficient of thermal expansion between the silicon semiconductor element and the insulating substrate. Further, the thermal conductivity of not smaller than 0.2 cal/sec.cm. °C. at room temperature means the lower limit to the range of thermal conductivity of sintered non-oxide ceramic which can be obtained with a good reproducibility without any adverse effect on the insulating property of higher than $10^7$ Ω.cm and the coefficient of thermal expansion.

The insulating substrate for use in the semiconductor device of the present invention is preferably made from sintered SiC containing 0.05 to 5% by weight of at least one of Be and a compound of Be in terms of Be element on the basis of total ceramic and having a relative density of not smaller than 90% to the theoretical density, where the insulating substrate having a high thermal conductivity of 0.4 cal/sec.cm. °C. or more can be obtained with a good reproducibility.

DESCRIPTION OF THE PREFERRED EMBODIMENTS

The invention will be described in detail, referring to embodiments.

Figure 2:
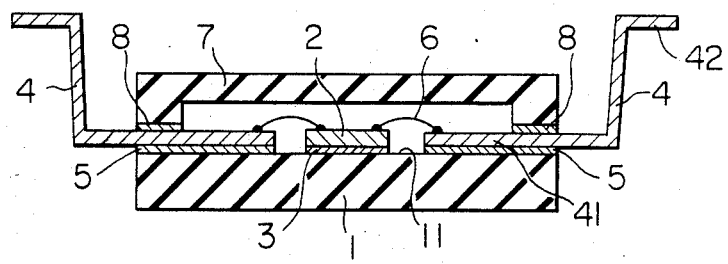
FIG. 2 is a sectional view showing schematically a semiconductor device according to one embodiment of the invention.
Figure 3:
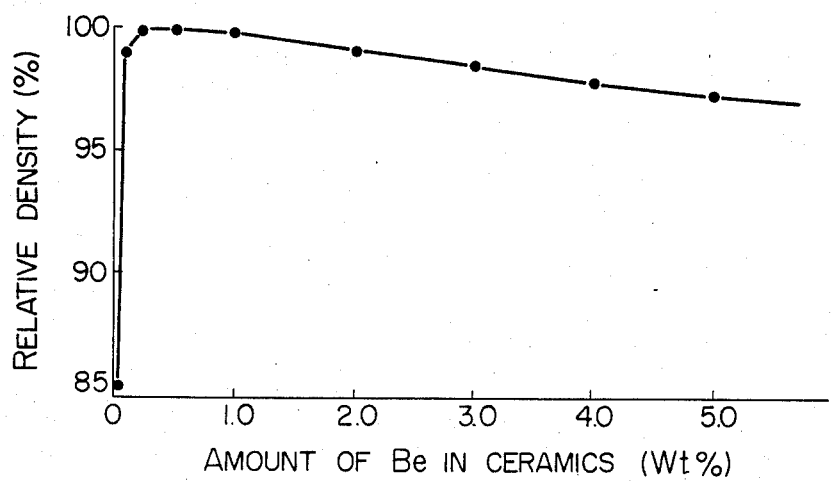
FIG. 3 is a diagram showing graphically a relationship between the Be content and the relative density of ceramics.
Figure 4:
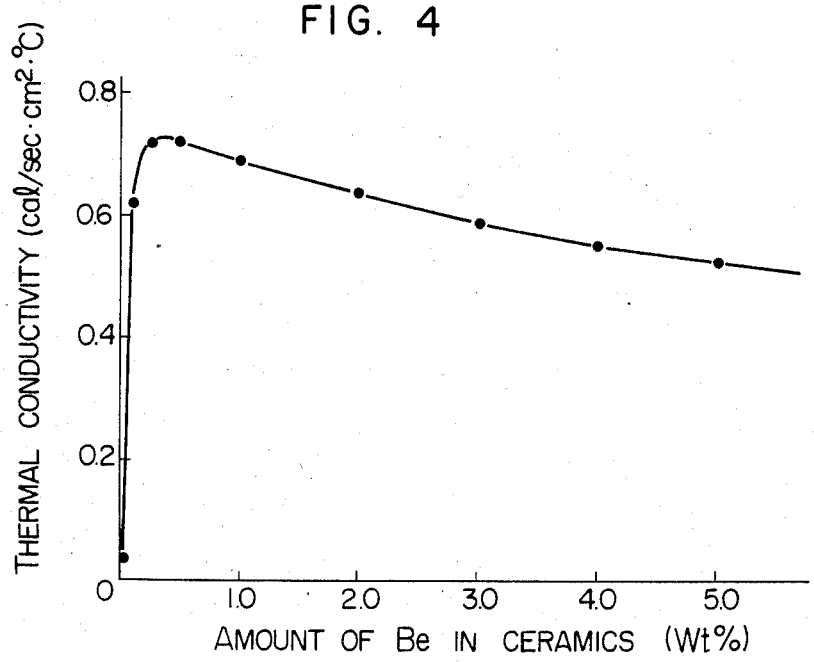
FIG. 4 is a diagram showing graphically a relationship between the Be content and the thermal conductivity of ceramics.
Figure 5:
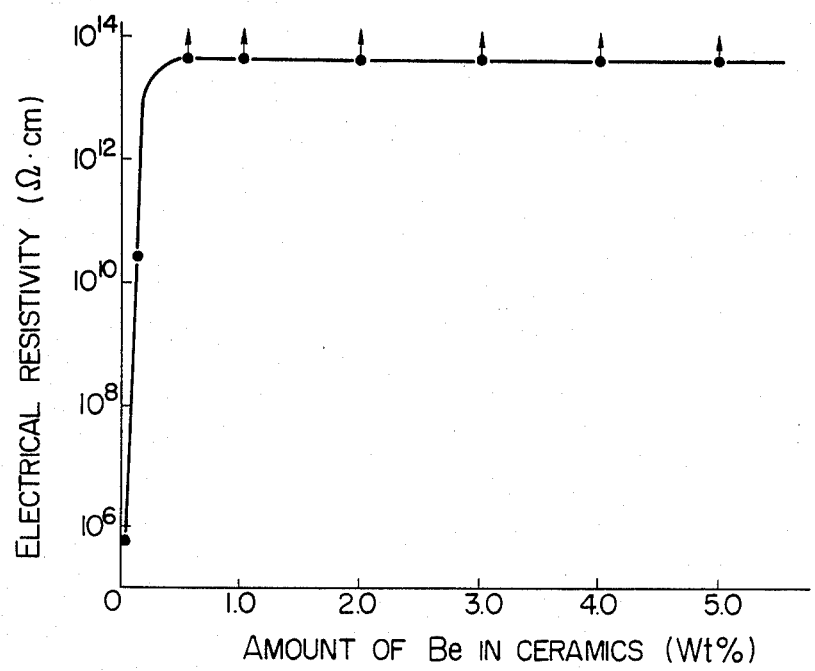
FIG. 5 is a diagram showing graphically a relationship between the Be content and the electrical resistivity of ceramics.
Figure 6:
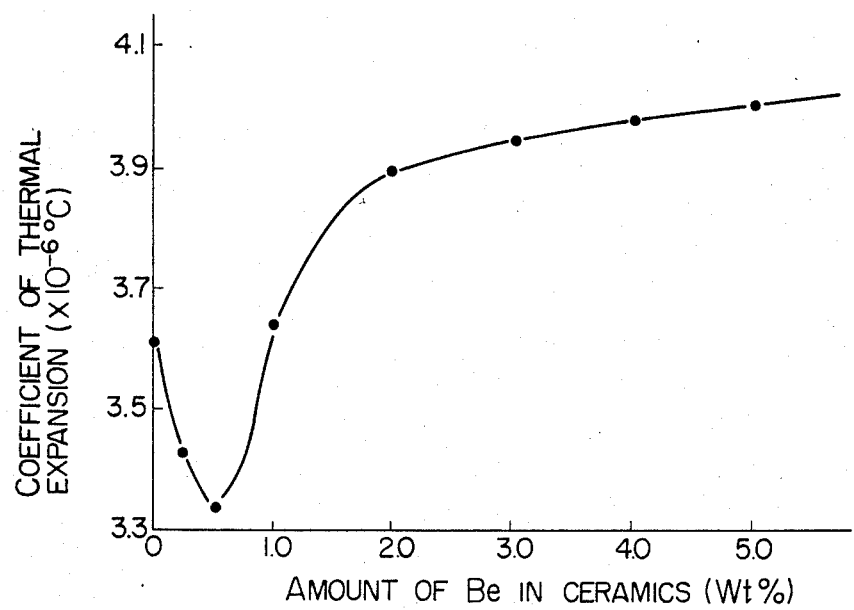
FIG. 6 is a diagram showing graphically a relationship between the Be content and the coefficient of thermal expansion of ceramics.

In FIG. 2 showing a semiconductor device according to an embodiment of the present invention, reference numeral 1 denotes an insulating substrate formed of SiC ceramics, and 2 denotes a semiconductor element such as IC, LSI, etc. soldered to one surface 11 of the insulating substrate 1 substantially at a center portion thereof by means of an interposed metallic solder layer 3. Reference numeral 4 denotes a plurality of lead members each having one end 41 bonded to the one surface 11 of the insulating substrate 1 by means of a sealing glass layer 5 and the other end portion 42 which extends outwardly from the outer peripheral portion of the one surface 11 of the insulating substrate 1. Numeral 6 denotes bonding wires each of which serves to electrically connect the one end 41 of the lead member 4 to the semiconductor element 2, and numeral 7 denotes a cap member of alumina which is bonded hermetically to the one surface 11 of the insulating substrate 1 and the lead members 4 by means of a solder glass layer 8 to form a hermetically sealed package in cooperation with the insulating substrate 1 to thereby encapsulate therein the semiconductor element 2, the one end portions 41 of the lead conductors 4 and the bonding wires 6. The SiC ceramics constituting the insulating substrate 1 of the semiconductor device according to the illustrated embodiment is formed of a sintered ceramic which contains 2% by weight of BeO in terms of Be element on the basis of total ceramic, the balance being SiC and incidental impurities, and which exhibits a relative density of 98% to the theoretical density. This SiC ceramic characteristically exhibits specific gravity of about 3.2, resistivity of $10^{13}$ Ω.cm at room temperature, a coefficient of thermal expansion of $40 \times 10^{-7}$/°C. in a range from room temperature to 900° C., thermal conductivity of 0.6 cal/sec.cm. °C. at room temperature, and bending strength of about 45 kg/mm² at room temperature.

Examination as to characteristics of the semiconductor device having the structure as described above reveals that the dielectric strength between the insulating substrate 1 and the lead members 4 is higher than 1000 V and the thermal resistance between the semiconductor element 2 and the insulating substrate of SiC ceramics is about 12.5° C.W. Further, neither deterioration such as damage, destruction or the like nor abnormality in the electric characteristics has been found in the semiconductor device even when subjected to an impact of about 50 G. These undesirable phenomena have not been observed even after the semiconductor device is subjected to 1000 thermal cycles of cooling and heating in the temperature range of −30° C. to +150° C.

The high dielectric strength attained in the semiconductor device mentioned above is due to such an arrangement that the semiconductor element is mounted on the insulating substrate made of SiC ceramic having a high insulation resistance. Further, the thermal resistance of a smaller value as compared with that of the hitherto known semiconductor device, as constructed as in the same structure as in FIG. 2, whose insulating substrate is formed of alumina ceramic, though, (in reality, the thermal resistance is decreased about 40% according to the invention) is due to the fact that the thermal conductivity of the SiC ceramic is about ten times as high as that of alumina. The increased shock or impact resistance as well as the enhanced resistance to the temperature changes, involving substantially no deterioration such as damage, etc., is due to the high mechanical strength of SiC ceramic. Further, the fact that no abnormality occurs in the electric characteristics of the semiconductor device after the aforementioned thermal cycles is explained by the fact that the coefficient of thermal expansion of Si which constitutes the matrix of the semiconductor element and that of the SiC ceramic which constitutes the insulating substrate approximate each other, making it difficult for stress to be produced in the bonded portion, whereby the semiconductor is positively protected from deformation, damages and other abnormalities.

The most important advantage of the semiconductor device having the structure as described above resides in that the thermal resistance is remarkably decreased. Another advantage can be seen in that need for interposing a thermal stress absorber, which is usually made of a heavy metal such as Mo, W or the like, between the semiconductor and the insulating substrate is obviated because of the approximated coefficients of thermal expansion of both. For this reason, the semiconductor device according to the instant embodiment can realize weight reduction by about 15% or more, as compared with the semiconductor of the equivalent size in which the insulating substrate is, however, formed of alumina. Moreover, significant reduction in the number of the required parts or components and the processing steps can be further seen to advantage.

In preparation of SiC ceramic for forming the insulating substrate, beryllium oxide (BeO) and silicon carbide (SiC) were pulverized to an average particle size of 10 μm or less and, preferably, of 2 μm or less. The pulverized mixture thus obtained was subjected to a hot press and sintered to form the insulating substrate of SiC ceramic. Although aluminum and boron should preferably be prevented from being admixed, it has been ascertained that low content of these two elements, for example, 0.1% by weight or less each, does not create a problem. However, when the content of aluminum is higher than this value, the electric resistivity of the sintered material will undesirably become smaller than $10^7$ Ω.cm. On the other hand, when the content of boron is higher than this value, the thermal conductivity becomes smaller than 0.4 cal/sec.cm. °C.

A semiconductor device having a thermal conductivity of not lower than 0.5 cal/sec.cm. °C. can be obtained by sintering pulverized silicon carbide material containing α-form SiC as the main component.

Also important is the condition for sintering pulverized silicon carbide containing beryllium oxide. The sintering must be effected in the non-oxidizing atmosphere. Otherwise, surfaces of pulverized silicon carbide particles would be oxidized, making it impossible to obtain the sintered material of high relative density. Further, furnace materials applicable to the oxidizing atmosphere at the sintering temperature of about 2000° C. is not available for the present.

The sintering should be effected at a temperature in a range of 1850° C. to 2500° C. and preferably in a range of 1900° C. to 2300° C. At a sintering temperature lower than 1850° C., the resulting product will have a low relative density. On the other hand, sintering at a temperature higher than 2500° C. will promote vigorous sublimation of silicon carbide, and fails to produce a dense ceramic due to excessive sintering. When the powder is pressed at a high sintering temperature according to the hot-press process, the upper limit of applicable load depends on the material of the hot-press die used. The ordinary die is made of graphite, where it is possible to apply a load of up to about 700 kg/cm$^2$.

In general, however, the sintered product of high relative density can be obtained without resorting to the use of such high load. The load in a range of 100 to 300 kg/cm$^2$ will usually be sufficient. It should be pointed out that pulverized silicon carbide having particle sizes on the submicron order can be formed into a sintered product of high relative density, for example, 90% to the theoretical density without applying such a high load. The optimal sintering time depends on the particle size of raw material powder, sintering temperature and load applied during sintering. It can generally be said that the smaller the particle size of raw material powder is, the higher the sintering temperature is and that the higher the applicable load during sintering is, the shorter the time required for obtaining the sintered product of high relative density is.

In this conjunction, description will be made below with reference to a concrete example.

Pulverized SiC having an average particle size of 2 $\mu$m is mixed with 0.1 to 20% by weight of pulverized BeO having an average particle size of not smaller than 10 $\mu$m. The mixture thus obtained is prssed under a load of 1000 kg/cm$^2$ at room temperature to prepare a molding having a density in a range of 1.60 to 1.67 g/cm$^3$ (which corresponds to a relative density of 50 to 52% to the theoretical density of SiC). Subsequently, the molding is placed within a die made of graphite and sintered according to the hot-press process under vacuum of $1 \times 10^{-5}$ to $1 \times 10^{-3}$ Torr and a load of 300 kg/cm$^2$, while heating it from room temperature to 2000° C. over about two hours, maintaining it at 2000° C. for an hour, and then leaving it cooling by turning off the power source. The load is released after it is cooled below 1500° C.

Relationships between characteristics of the sintered SiC product thus obtained and the content of Be are graphically shown in FIGS. 3 to 6. It will be seen from these diagrams that a sintered product having a high density (relative density of not smaller than 90% to the theoretical density), a high thermal conductivity (0.4 cal/sec.cm. °C. or higher), a high electric resistivity ($10^{13}$ $\Omega$.cm or higher), and a low coefficient of thermal expansion ($4 \times 10^{-6}$/°C. or less) can be obtained.

These results are also applicable to Si$_3$N$_4$ and AlN, though the thermal conductivity is a little lowered, for example, 0.2 cal/sec.cm. °C. However, the thermal conductivity is nevertheless significantly higher than that of alumina. Thus, there is no practical problem.

Figure 7:
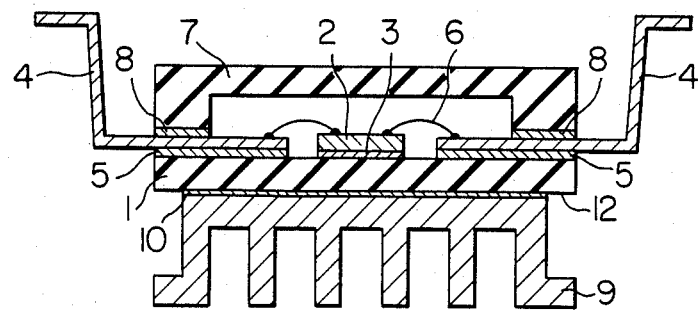
FIGS. 7 to 9 are sectional views showing schematically structures of the semiconductor devices according to other embodiments, respectively, of the present invention.

FIG. 7 shows a semiconductor device according to another embodiment of the invention which differs from the one shown in FIG. 2 in that a cooling fin 9 is provided on the other side of insulating substrate 1 through an interposed bonding layer 10. The cooling fin 9 should preferably be made of a metal such as aluminium, while the bonding layer 10 may be formed from an epoxy or polyimid resin, metal or glass. An alloy containing manganese such as Cu—Mn, Ni—Mn or the like may be advantageously used for forming the metallic bonding layer having a higher bonding strength and a shorter bonding time.

The semiconductor device of the structure as described above has a high dielectric strength as well as increased resistances to thermal fatigue and shocks, as is the case of the device shown in FIG. 2. It is found that the thermal resistance between the semiconductor element 2 and the cooling fin 9 is on the order of 9.3° C.w, which is obviously lower by about 25% than the corresponding thermal resistance of the semiconductor device shown in FIG. 7, i.e. 12.5° C.w. Such reduction in the thermal resistance is attributable to the provision of the cooling fin 9. When compared with the thermal resistance of about 11.5° C.w as in the conventional semiconductor which has the same structure as that of the embodiment shown in FIG. 2 only except that the insulating substrate 1 is formed of alumina ceramic, the thermal resistance of the semiconductor device shown in FIG. 7 is decreased by about 20%, which results from the fact that the insulating substrate of SiC ceramics has a much better thermal conductivity than a conventional substrate of alumina.

Figure 8:
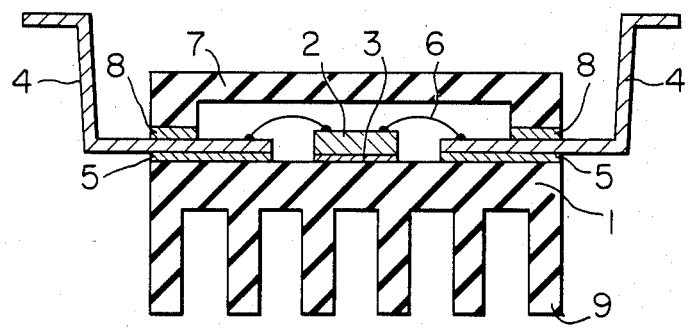

FIG. 8 shows a semiconductor device according to a further embodiment of the invention. This device is different from the one shown in FIG. 7 in that the insulating substrate 1 is formed of SiC ceramic integrated with cooling fin 9. The same SiC ceramic material forming the integrated structure of the insulating substrate and the cooling fin is used as in the semiconductor device shown in FIG. 2 and has the same physical properties and parameters as those of FIG. 2.

It has been experimentally ascertained that the semiconductor device shown in FIG. 8 has a dielectric strength and resistances to thermal fatigue and shock comparable to those of the device shown in FIG. 2. Further, the device shown in FIG. 8 has a thermal resistance of about 5.1° C.w, which means reduction by about 45% of the thermal resistance of the device shown in FIG. 7 in which the separately fabricated cooling fin is bonded to the insulating substrate by a binder resin. Such remarkable reduction in the thermal resistance is due to the fact that the insulating substrate and the cooling fin are integrally formed from SiC ceramics having a thermal conductivity comparable to that of aluminium and to elimination of the layer of the binder resin having a poor thermal conductivity, for example, epoxy resin.

Figure 1:
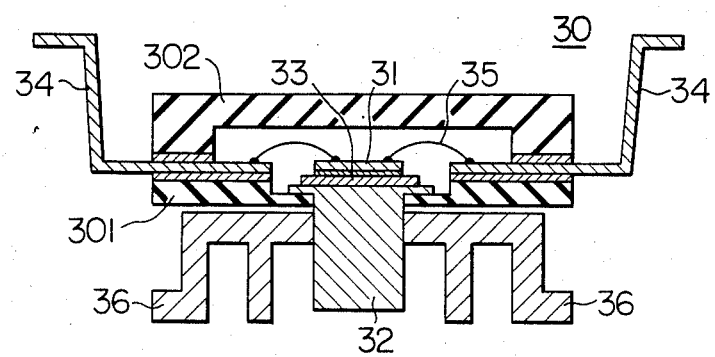
FIG. 1 shows a schematic sectional view of a hitherto known semiconductor device housed within a ceramic package.

Moreover, in addition to said advantage of the semiconductor device shown in FIG. 8, i.e. reduction in the thermal resistance by about 45% when compared with the hitherto known device using an alumina insulating substrate as shown in FIG. 1, the overall weight of the device can be decreased by about 50% because of elimination of heavy metals such as Cu and Mo. Besides, the structure is more simple and economically more advantageous, because of the reduced number of components and the reduced number of manufacturing steps.

As described above, the semiconductor device shown by a FIG. 8 is distinguished not only in better heat dissipation characteristic but also by simpler structure, lighter weight, and lower cost, while maintaining other desired characteristics.

Although the cooling fin is formed from electrically insulating SiC dense ceramic in the case of the embodiment described above, the cooling fin may be also formed from porous electrically conductive material, only so far as the fin is concerned. In that case, it has been found that the heat resistance comparable to that of the embodiment shown in FIG. 8 can be attained.

Figure 9:
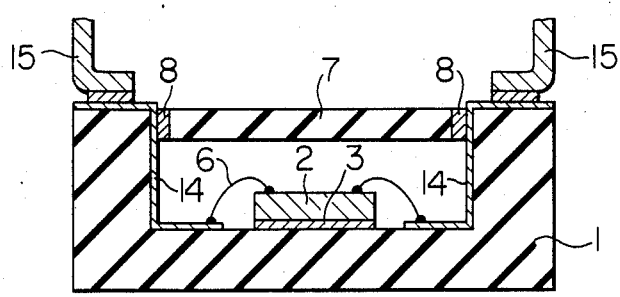
Figure 10:
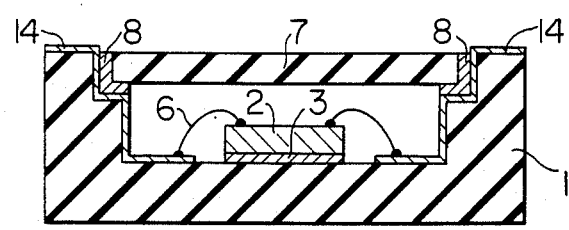

FIGS. 9 and 10 show semiconductor devices according to further embodiments of the invention, which differ from those so far described above in that no lead members extending from the interior to the exterior of the package are provided. That is, metal wiring layers 14 are formed on the inner surface of insulating substrate 1, and bonding wire 6 are connected to the inner end portions of the metal wiring layers 14, while the external end portions of the metal wiring layers are provided with lead members 15 (FIG. 9) or made to serve as terminals as such (FIG. 10). The embodiments shown in FIGS. 9 and 10 have similar functions and effects to those of the device shown in FIG. 2.

In the foregoing, typical embodiments of the present invention have been described. Modifications and variations of these embodiments can be readily made. For example, in the embodiment shown in FIG. 10, cap member 7 may be formed from the same ceramic as that of the insulating substrate in view of the embodiments shown in FIGS. 2 and 7. A plurality of the semiconductor elements may obviously be disposed on the insulating substrate. Circuit elements other than the semiconductor elements may be disposed on the insulating substrate together with the semiconductor elements.

What is claimed is:

1. A semiconductor device comprising:
    an insulating substrate comprising a SiC ceramic containing 0.05 to 5% by weight of at least one of Be and a compound of Be in terms of Be element on the basis of total ceramic and having a relative density of not lower than 90% to the theoretical density, a coefficient of thermal expansion approximating that of a semiconductor material and a thermal conductivity not smaller than 0.2 cal/sec.cm. °C. at room temperature.
    at least one semiconductor element disposed at a predetermined location on one surface of said insulating substrate;
    a cap member made of alumina ceramic bonded to a preselected portion on one surface of the insulating substrate by a solder glass layer, thereby forming a package hermetically enclosing the semiconductor element together with the insulating substrate; and
    a terminal means having one end that is electrically connected to the semiconductor element within the package and another end that is exposed at the outside of said package, said terminal means being bonded to said insulating substrate by a sealing glass layer.

2. The semiconductor device according to claim 1, wherein a cooling fin is mounted on the other surface of the insulating substrate.

3. The semiconductor device according to claim 1, wherein a cooling fin is formed at the other surface of the insulating substrate integrally with the insulating substrate, the cooling fin being made of the same material as that of the insulating substrate.

4. A semiconductor device according to claim 1 wherein the insulating substrate exhibits a high thermal conductivity of at least 0.4 cal/sec.cm. °C.

5. A semiconductor device according to claim 1 wherein the insulating substrate exhibits a coefficient of thermal expansion on the order of $4 \times 10^{-6}/°C$. or less.

6. A semiconductor device according to claim 1 wherein the SiC ceramic contains 0.05 to 5% by weight of beryllium oxide in terms of beryllium on the basis of the total ceramic.

* * * * *